(12) United States Patent
Lue

(10) Patent No.: US 7,133,316 B2
(45) Date of Patent: Nov. 7, 2006

(54) PROGRAM/ERASE METHOD FOR P-CHANNEL CHARGE TRAPPING MEMORY DEVICE

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 86 days.

(21) Appl. No.: 10/857,866

(22) Filed: Jun. 2, 2004

(65) Prior Publication Data
US 2005/0270849 A1    Dec. 8, 2005

(51) Int. Cl.
*G11C 16/04* (2006.01)

(52) U.S. Cl. .......................... 365/185.28; 365/185.18; 365/185.29

(58) Field of Classification Search ........... 365/185.28, 365/185.05, 185.03, 185.26; 257/315, 316, 257/324
See application file for complete search history.

(56) References Cited

U.S. PATENT DOCUMENTS

| | | | |
|---|---|---|---|
| 6,011,725 A | | 1/2000 | Eitan |
| 6,324,099 B1 | * | 11/2001 | Iijima ..................... 365/185.24 |
| 6,339,540 B1 | * | 1/2002 | Lavi ........................... 365/49 |
| 6,771,545 B1 | * | 8/2004 | Hsia et al. ............. 365/185.29 |
| 6,809,373 B1 | * | 10/2004 | Nishizaka .................... 257/315 |
| 6,885,590 B1 | * | 4/2005 | Zheng et al. ........... 365/185.29 |
| 6,914,293 B1 | * | 7/2005 | Yoshino ...................... 257/324 |

OTHER PUBLICATIONS

C.C. Yeh et al., "PHINES: A Novel Low Power Program/Erase, Small Pitch, 2-Bit per Cell Flash Memory," IEDM 2002, pp. 931-934.
T. Ohnakado et al., "Novel Electron Injection Method Using Band-to-Band Tunneling Induced Hot Electron (BBHE) for Flash Memory with a P-channel Cell," IEDM, 1995, Section 11.5, pp. 279-282.
Marvin H. White et al., "On the go with SONOS," IEEE Circuit and Device Magazine, Jul. 2000, pp. 22-31.

* cited by examiner

Primary Examiner—Gene N. Auduong
(74) Attorney, Agent, or Firm—Akin Gump Strauss Hauer & Feld, LLP

(57) ABSTRACT

A method of operating a memory device is disclosed, wherein the memory device includes an n-type substrate and a plurality of memory cells formed thereon, each memory cell corresponding to a word line, a first bit line, and second bit line, and including a first bit portion and a second bit portion each for storing one bit of information. The method includes resetting a selected memory cell by applying a first negative bias to the word line of the selected memory cell and applying a ground bias to the first and second bit lines, and programming the first bit portion of the selected memory cell by applying a first positive bias to the word line of the selected memory cell, applying a second negative bias to the first bit line of the selected memory cell, and applying a ground bias to the second bit line of the selected memory cell.

23 Claims, 9 Drawing Sheets

PROGRAM/ERASE METHOD FOR P-CHANNEL CHARGE TRAPPING MEMORY DEVICE

DESCRIPTION OF THE INVENTION

1. Field of the Invention

This invention is in general related to a memory device, and more particularly, to a novel flash memory device that utilizes band-to-band tunneling induced hot electron injection.

2. Background of the Invention

Memory devices for non-volatile storage of information have been widely in use. Examples of such memory devices include read only memory (ROM), programmable ROM (PROM), erasable programmable ROM (EPROM), electrically erasable programmable ROM (EEPROM), and flash EEPROM. A flash memory generally refers to a flash EEPROM, which may be erased in blocks of data instead of one byte at a time.

A flash memory device generally includes an array of memory cells arranged in rows and columns. Each memory cell includes a MOS transistor structure having a gate, a drain, a source, and a channel defined between the drain and the source. The gate corresponds to a word line, and the drain or source corresponds to a bit line of the memory array. The gate of a conventional flash memory cell is generally a dual-gate structure, including a control gate and a floating gate, wherein the floating gate is sandwiched between two dielectric layers to trap carriers such as electrons, to "program" the cell. In other words, in a conventional cell, a first dielectric layer is formed over the channel, the floating gate is formed over the first dielectric layer, a second dielectric layer is formed over the floating gate, and the control gate is finally formed over the second dielectric layer.

During programming, a set of programming biases are applied to selected word lines and bit lines. One or more memory cells corresponding to the selected word lines and bit lines are biased in the programming state. For a single memory cell, different biases applied to the source and drain thereof create an electric field along the channel thereof, through which electrons gain enough energy to tunnel through the first dielectric layer into the floating gate and become stored therein. As a result of the stored electrons in the floating gate, the threshold voltage of the memory cell is modified. The changing of the threshold voltage determines whether the memory cell is programmed.

To read a memory cell, reading biases are applied and a sensing device reads a current passing through the memory cell. If a memory cell is programmed, or has electrons stored in its floating gate, its current level is different from those memory cells which are not programmed. Therefore, based on the measured current level, the sensing device is capable of determining the state of each memory cell.

To erase the information stored in a flash memory cell, erasing biases are applied thereto to force the stored electrons to tunnel out of the floating gate, through a well-known mechanism of Fowler-Nordheim (F-N) tunneling.

However, certain problems are associated with the conventional flash memory, such as high power consumption and program and read disturbances. High power consumption is due to high program and erasure voltages required to induce electron tunneling for program and erase operations. Program and read disturbances relate to current leakage occurring at non-selected neighboring memory cells.

A disturbance occurs when one selected cell in the memory array is being read or programmed, another non-selected programmed memory cell sharing the same word line or bit line experiences current leakage caused by electron tunneling of the selected cell, and a loss of electrons stored in the floating gate of the non-selected memory cell may result in a change of status from "programmed" to "erased". The read disturbance is further explained with reference to FIG. 1, which shows a flash memory array comprising conventional floating gate memory cells.

Referring to FIG. 1, a flash memory array 100 includes a plurality of word lines WL1, WL2, ... WL6, and a plurality of bit lines BL1, BL2, ..., BL5. Each intersection of the word lines and bit lines defines a memory cell. Each of the memory cells also includes a floating gate (not numbered). As indicated, a memory cell A corresponding to word line WL3 and bit lines BL2 and BL3 is selected by biasing the corresponding word line and bit lines. For example, cell A is selected by biasing word line WL3 at 3V, biasing bit line BL2 at 0.3V, and biasing bit line BL3 at 1.5V. Word lines WL1, WL2, WL4, WL5, and WL6 are grounded (0V), and bit lines BL1, BL4, and BL5 are unbiased, or floating (F). Under such biasing conditions, the information stored in cell A may be read.

Meanwhile, the memory cells sharing the same word line or bit line with cell A are also under certain biases. For example, cell B shares the same word line WL3 and bit line BL2 with cell A. Therefore, assuming bit line BL2 corresponds to the drain of cell B, an electric field exists between the gate and the drain of cell B, which induces a current leakage in cell B. The leakage current through cell B depends on the threshold voltage thereof, which depends, in turn, on the electron density in the floating gate. In other words, a lower threshold voltage will result in a higher leakage current. Similarly, cells C and D may experience current leakages due to the biases at bit line BL2 and bit line BL3, respectively. The leakage currents through the neighboring cells, e.g., cells B, C, and D, will flow through bit lines BL2 and BL3, and may generate sensing errors of cell A.

SUMMARY OF THE INVENTION

In accordance with the present invention, there is provided a method of operating a memory device, wherein the memory device includes an n-type substrate and a plurality of memory cells formed thereon, each memory cell including a control gate, a source region, a drain region, a channel region defined between the source and drain regions, a trapping layer provided above the channel region, a first insulating layer provided between the trapping layer and the channel region, and a second insulating layer provided between the trapping layer and the control gate, wherein the control gate corresponds to a word line, the source region corresponds to a first bit line, and the drain region corresponds to a second bit line, and wherein each memory cell includes a first bit portion and a second bit portion each for storing one bit of information. The method includes resetting a selected memory cell by applying a first negative bias to the word line of the selected memory cell and applying a ground bias to both the first bit line and the second bit line, and programming the first bit portion of the selected memory cell by applying a first positive bias to the word line of the selected memory cell, applying a second negative bias to the first bit line of the selected memory cell, and applying a ground bias to the second bit line of the selected memory cell.

In accordance with the present invention, there is also provided an operation method of a memory device, wherein the memory device includes a semiconductor substrate, a plurality of discontinuous bit lines formed in the substrate, each discontinuous bit line including a plurality of diffusion regions spaced apart from each other, and a plurality of word lines formed over the substrate, wherein the plurality of word lines and the plurality of discontinuous bit lines define a plurality of memory cells, each memory cell corresponding to one word line and two consecutive ones of the plurality of diffusion regions of a discontinuous bit line, and wherein each discontinuous bit line has a first end and a second end. The operation method includes selecting a memory cell by applying a turn-on voltage to all of the plurality of word lines except the word line of the selected memory cell and applying a ground bias to both the first end and the second end of all of the plurality of discontinuous bit lines except the discontinuous bit line of the selected memory cell, and operating the selected memory cell.

In accordance with the present invention, there is still provided a memory device that includes a semiconductor substrate, a plurality of discontinuous bit lines formed in the substrate, wherein each discontinuous bit line includes a plurality of diffusion regions spaced apart from each other, a first insulating layer formed over the substrate, a trapping layer formed over the first insulating layer, a second insulating layer formed over the trapping layer, and a plurality of word lines formed over the second insulating layer. The plurality of word lines and the plurality bit lines define a plurality of memory cells, each memory cell corresponding to one word line and two consecutive ones of the plurality of diffusion regions of one of the discontinuous bit lines, and wherein each memory cell includes a transistor formed by the corresponding word line and the corresponding two consecutive diffusion regions.

In accordance with the present invention, there is further provided a memory device that includes an n-type substrate, a first p-type diffusion region formed in the substrate corresponding to a first bit line, a second p-type diffusion region formed in the substrate corresponding to a second bit line, a channel region defined as a part of the substrate between the first p-type diffusion region and the second p-type diffusion region, a first insulating layer formed over the channel region, a trapping layer provided formed over the first insulating layer, a second insulating layer formed over the trapping layer, and a control gate formed over the second insulating layer corresponding to a word line. The trapping layer includes a first part for storing a first bit of information and a second part for storing a second bit of information.

Also in accordance with the present invention, there is provided a memory device that includes a semiconductor substrate, a plurality of bit lines each including a diffusion region formed in the substrate, a first insulating layer formed over the substrate, a trapping layer formed over the first insulating layer, a second insulating layer formed over the trapping layer, and a plurality of word lines formed over the second insulating layer. The plurality of word lines and the plurality bit lines define a plurality of memory cells, each memory cell corresponding to one word line and two adjacent bit lines, and wherein each memory cell includes a transistor formed by the corresponding word line and the corresponding two adjacent bit lines.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the preferred embodiments of the invention, examples of which are illustrated in the accompanying drawings. Wherever possible, the same reference numbers will be used throughout the drawings to refer to the same or like parts.

According to the present invention, there is provided a novel flash memory device that utilizes a method of band-to-band tunneling induced hot electron injection (BTBTHE). The memory device may comprise a memory array including a matrix of memory cells.

Figure 1:
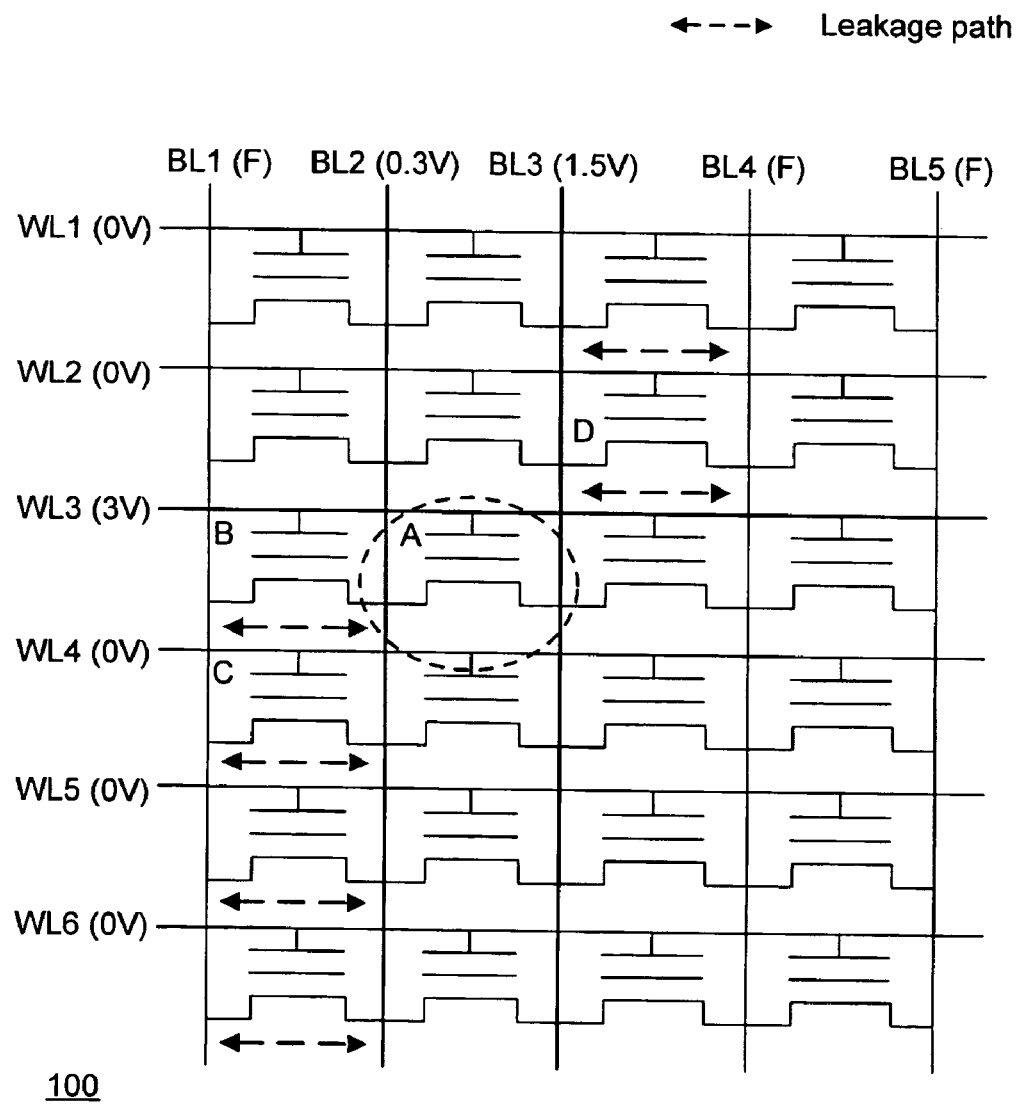
FIG. 1 is a circuit diagram of a conventional flash memory array and illustrates a leakage problem associated with a conventional flash memory array.
Figure 2:
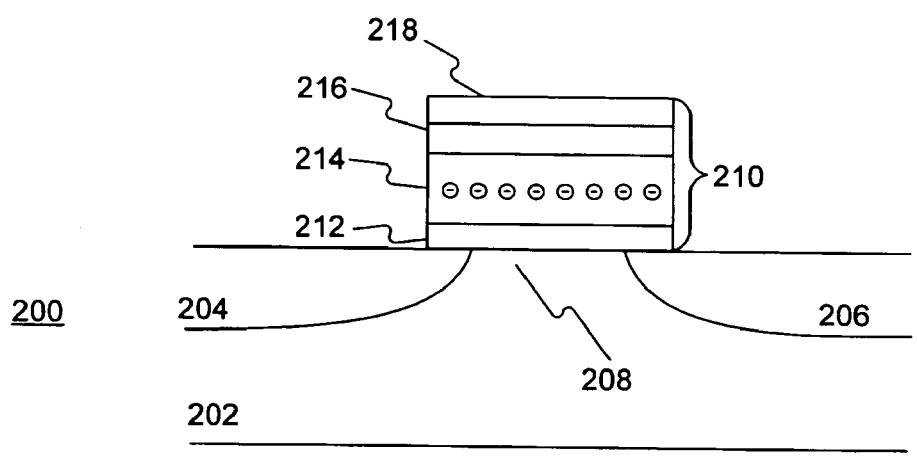
FIG. 2 shows a memory cell consistent with the present invention.

FIG. 2 shows the cell structure of an exemplary memory cell 200 consistent with the present invention. Referring to FIG. 2, there is provided a semiconductor substrate 202 with two diffusion regions 204 and 206 formed therein. Semiconductor substrate 202 may comprise any conventional semiconductor material, such as silicon. In one aspect, substrate 202 is doped with n-type impurities, and diffusion regions 204 and 206 are doped with p-type impurities. A multi-layer gate structure 210 is formed over a channel region 208 defined in semiconductor substrate 202 between source 204 and drain 206. Gate structure 210 includes a first insulating layer 212, a trapping layer 214, a second insulating layer 216, and a control gate 218. First insulating layer 212 may comprise silicon dioxide, trapping layer 214 may comprise silicon nitride, second insulating layer 216 may comprise silicon dioxide, and control gate 218 may comprise polycrystalline silicon, a metal, metal silicide, or a combination thereof. Thus, memory device 200 is a p-type MOS transistor, with diffusion regions 204 and 206 as the source and drain thereof, respectively.

In one aspect, control gate 218 corresponds to a word line of the memory array, and source 204 and drain 206 correspond to bit lines of memory array. Therefore, each memory cell has a corresponding word line and a pair of corresponding bit lines, or a first bit line and a second bit line.

FIG. 2 shows a distribution profile of electrons in trapping layer 214 before memory cell 200 is programmed. It is to be understood that the electron profile shown in FIG. 2 is not drawn to scale. It is also to be understood that a MOS structure is generally symmetrical and the source and drain are interchangeable. Therefore, in the above and following descriptions, the source and drain of memory cell 200, or the first and second bit lines, may be interchanged without affecting the functions thereof or the scope of the present invention.

Because trapping layer 214 is non-conductive, when carriers tunnel into trapping layer 214, the carriers are trapped therein and become relatively immobile. By controlling the biases on control gate 218, source 204, and drain 206, it is possible to control into which part of trapping layer 214 the carriers tunnel. Therefore, trapping layer 214 may be divided into two parts, a first bit and a second bit, each for the storage of one bit of information. In one aspect, the first bit corresponds to the part of trapping layer 214 adjacent to the first bit line, or source 204, and the second bit corresponds to the part of trapping layer 214 adjacent to the second bit line, or drain 206. By controlling the part of trapping layer 214 into which the carriers tunnel, the first bit and the second bit may be respectively programmed, read, or erased. Since the source and drain of a MOS structure are generally interchangeable, the programming or reading method for the first bit of memory cell 200 may also be applied to program or read the second bit. Therefore, only the method for the first bit is described herein.

The operations of memory cell 200 are next explained with reference to FIGS. 3A–3E and 4.

Figure 3A:
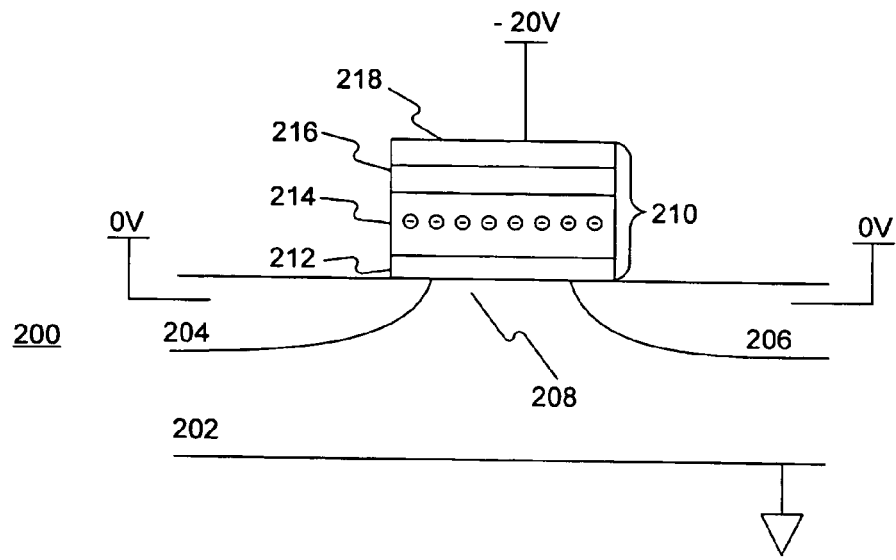
FIGS. 3A–3E illustrate the operation of the memory cell of FIG. 2.

Referring to FIG. 3A, memory cell 200 is first reset by applying a first set of biases thereto. Specifically, the word line, or control gate 218, is biased at a high negative voltage, e.g., −20V, and both the first bit line, or source 204, and the second bit line, or drain 206, are grounded. Substrate 202 is also grounded. Thus, a strong vertical electric field is created across gate structure 210. Under the strong electric field, two electron tunneling processes take place. In the first tunneling process, electrons tunnel from control gate 218, through second insulating layer 216, into trapping layer 214. In the second tunneling process, electrons tunnel from trapping layer 214, through first insulating layer 212, into channel regions 208. A dynamic balance may be reached between the two tunneling processes, which is defined as the reset state of memory cell 200. In one aspect, at the dynamic balance, the concentration of electrons in trapping layer 214 is such that a threshold voltage, $V_{th}$, of memory device 200 is positive. Thus, memory device 200 is turned on as long as $V_g - V_d < V_{th}$ or $V_g - V_s < V_{th}$, wherein $V_g$ is the bias at control gate 218, $V_d$ is the bias at drain 206, and $V_s$ is the bias at source 204. Therefore, memory device 200 is a depletion mode MOS transistor at the reset state.

Figure 3B:
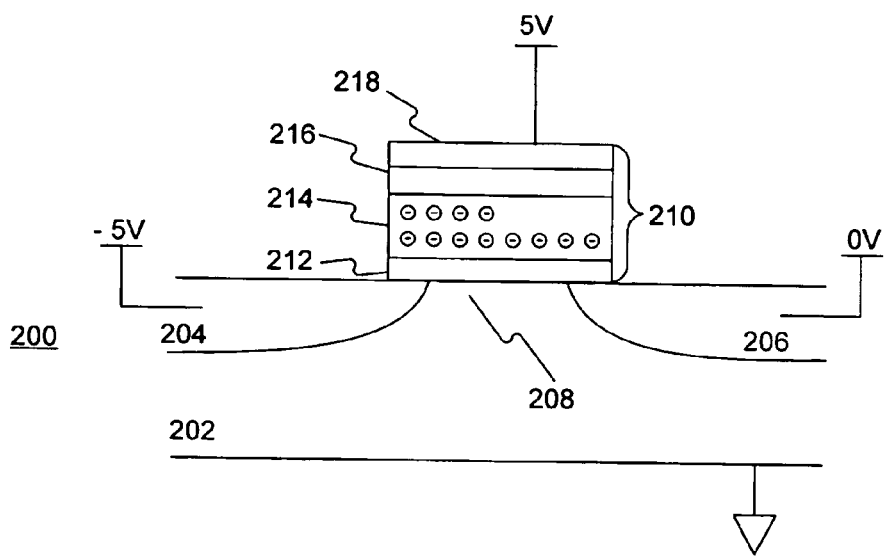

Referring to FIG. 3B, the first bit of memory cell 200 is programmed by applying a second set of biases thereto, wherein the word line, or control gate 218, is biased at a positive voltage, e.g., 5V, the first bit line of memory cell 200, or source 204, is biased at a negative voltage, e.g., −5V, and both the second bit line of memory cell 200, or drain 206, and substrate 202 are grounded. Thus, the junction between source 204 and substrate 202 is reversely biased, creating a deep depletion region therebetween. Because of the deep depletion region and, therefore, a strong electric field across the junction, electrons tunnel from the valence band on the side of source 204 to the conduction band on the side of substrate 202, and are accelerated by an electric field created by the biases at the first and second bit lines along channel region 208. As the electrons are accelerated along channel region 208 and attain high energy, the vertical electric field due to the positive control gate bias "pulls" some of the electrons out of channel region 208 and the electrons are injected into trapping layer 214. In other words, electrons tunnel through first insulating layer 212 into trapping layer 214. Since the electrons gain most of their energy in the neighborhood of source 204, or the first bit line, they tunnel into the part of trapping layer 214 that is adjacent to the first bit line. Therefore, in that part of trapping layer 214, the distribution profile of the electrons is modified such that the density of the electrons is higher. To facilitate illustration, a threshold voltage $V_{th1}$ of a programmed bit may be defined as the potential drop between the control gate of the memory cell and the corresponding bit line required for generation of a channel near that bit line. According to the programming method as discussed above, when the first bit of memory cell 200 is programmed, electron concentration is increased in trapping layer 214 near source 204. Therefore, it would be easier to generate a p-type channel in channel region 208 near the source-substrate junction. In other words, $V_{th1}$ is higher than $V_{th}$. In one aspect, both the first bit and the second bit of memory cell 200 in the reset state are considered in a logic low state, or "0", and after programming with the above-described method, the programmed bit may be considered as in the state of "1", or logic high state. During the programming operation, because memory cell 200 is off, leakage current is very small.

Figure 3C:
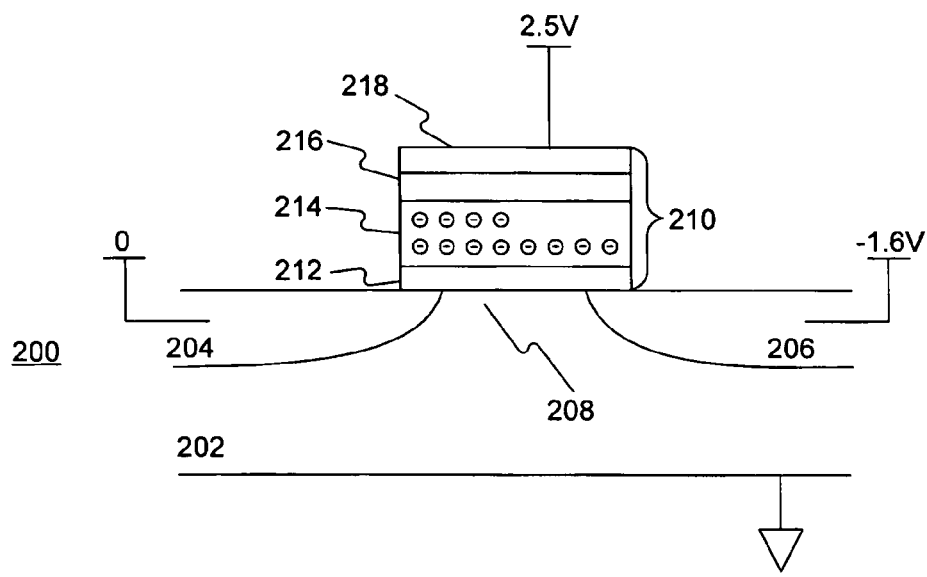

To read the first bit of memory cell 200, a third set of biases is applied thereto. Specifically, the word line, or control gate 218, is biased at a positive voltage, e.g., 2.5V, the first bit line, or source 204, is grounded, and the second bit line, or drain 206, is biased at a negative voltage, e.g., −1.6V, as shown in FIG. 3C. A sensing circuit (not shown) external to memory cell 200 then senses the current passing through channel 208 due to the bias difference between source 204 and drain 206. In one aspect, the difference between the bias at control gate 218 and the bias at source 204 is between $V_{th1}$ and $V_{th}$, i.e., $V_{th} < V_g - V_s < V_{th1}$. Thus, the first bit will be turned on if it is programmed, and will be turned off if it is in the reset state. By sensing the current passing through memory cell 200, it may be determined whether the first bit is programmed or not.

Figure 3D:
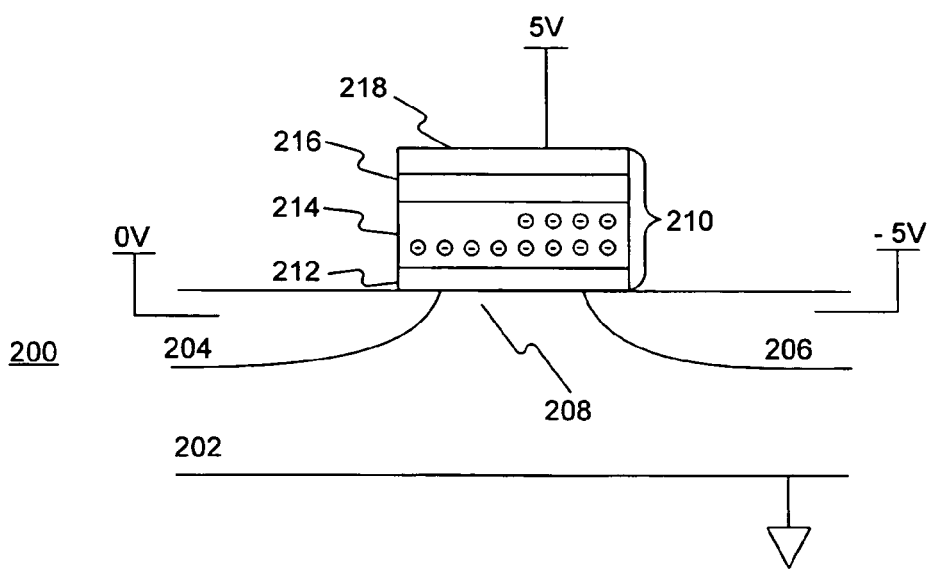

FIG. 3D shows the bias conditions for programming the second bit of memory device 200. As shown in FIG. 3D, the second bit is programmed in the same manner as the first bit and, therefore, the details thereof are not described herein.

Figure 3E:
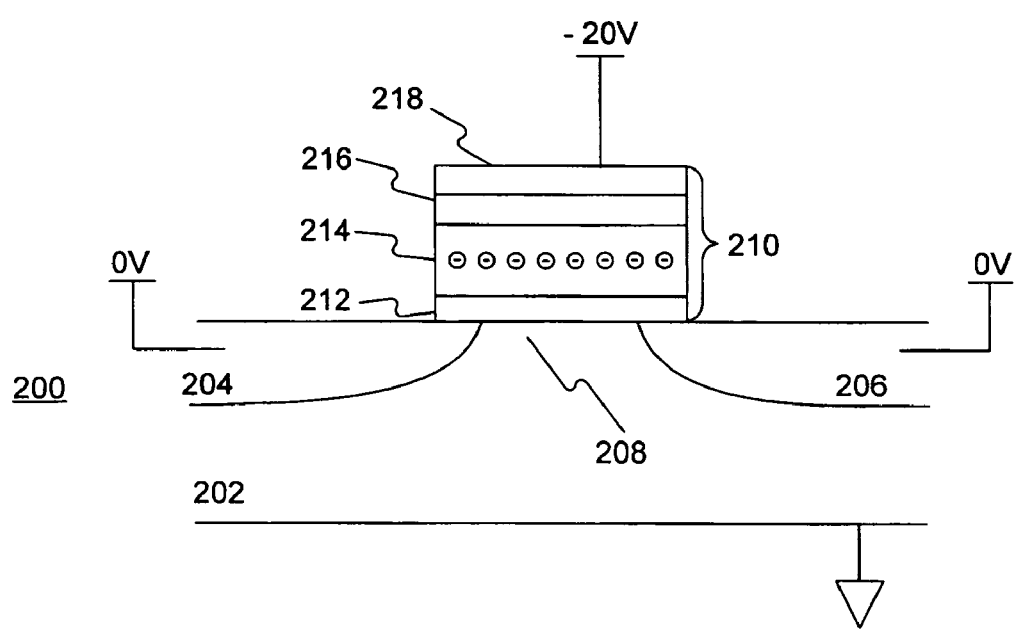

To erase memory cell 200, a fourth set of biases may be applied thereto, as shown in FIG. 3E. In one aspect, the fourth set of biases may be the same as the first set of biases, i.e., the word line, or control gate 218, is biased at a high negative voltage, e.g., −20V, and all of the first bit line, or source 204, the second bit line, or drain 206, and substrate 202 are grounded. Under these bias conditions, the same dynamic balance between the two electron tunneling processes described earlier may be reached and memory cell 200 is restored to the reset state.

Figure 4:
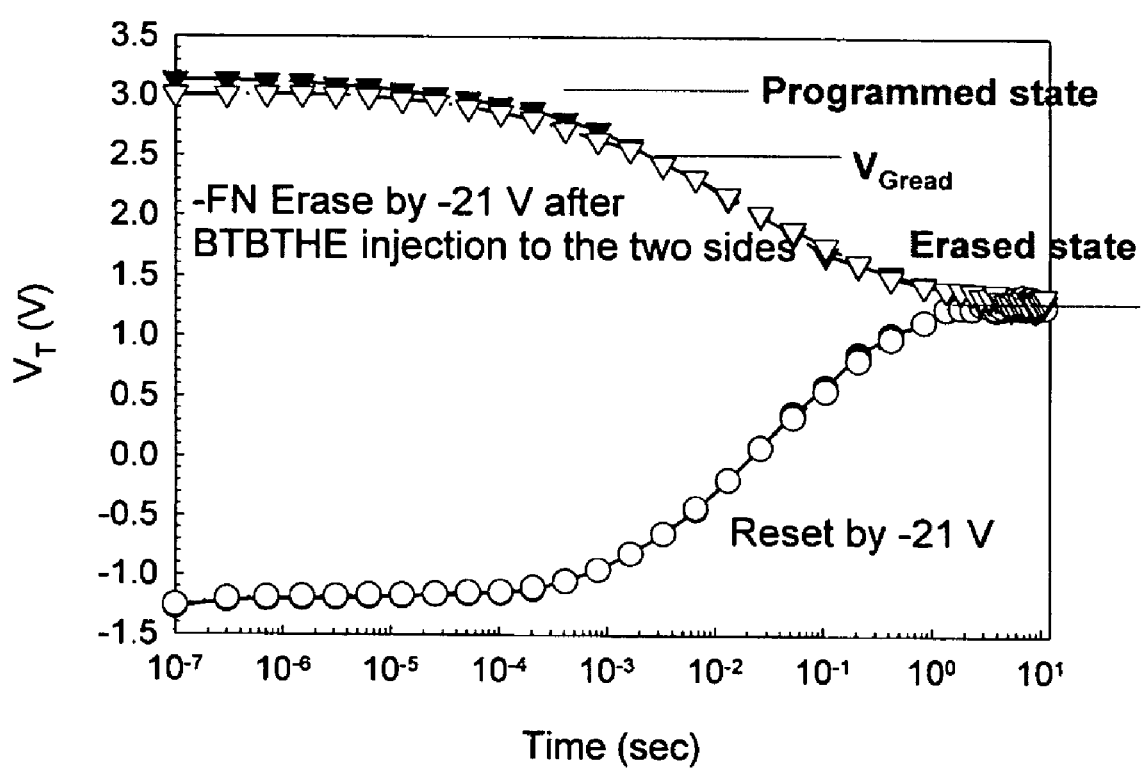
FIG. 4 graphically illustrates simulated results of the shift of threshold voltage of a memory cell during reset and erase operations consistent with the present invention.

FIG. 4 graphically illustrates simulated results of the shift of threshold voltage of a memory cell during reset and erase operations consistent with the present invention, wherein circles indicate the shift of threshold voltage with respect to time during reset operation and triangles illustrate the shift of threshold voltage of a programmed bit during erase operation. It is assumed for the simulation that the thickness of first insulating layer 212 is 54 Å, the thickness of trapping layer 214 is 60 Å, and the thickness of second insulating layer 216 is 90 Å.

As shown in FIG. 4, prior to the reset operation, the memory cell may comprise an enhanced mode p-MOS transistor and the threshold voltage thereof is negative, for example, approximately −1.3V. After reset, the threshold voltage shifts to a positive value, e.g., approximately 1.5V. If a bit of the memory cell is programmed, the threshold of that bit is approximately 3.0V. After the programmed bit is erased, the threshold thereof is restored to the value in the reset state, i.e., approximately 1.5V. FIG. 4 also indicates that the curves of the threshold voltage with respect to time converge after reset or erase, because, as discussed above, the same dynamic balance between the two electron tunneling processes is reached after the memory cell is reset or erased.

In one aspect, control gate 218 may comprise $N^+$ polysilicon, $P^+$ polysilicon, or a metal layer. In another aspect, the material of control gate 218 has a high work function, creating a barrier between control gate 218 and second insulating layer 216. Such barrier may suppress electron injection from control gate 218 to trapping layer 214. In still another aspect, second insulating layer 216 may comprise a high-dielectric material, such as aluminum oxide ($Al_2O_3$), to reduce the electric field therein during reset or erase operations. In yet another aspect, trapping layer 214 may comprise other trapping materials, such as $Al_2O_3$ or $HfO_2$ (hafnium oxide). Further, in another aspect, the thickness of first insulating layer 212 is controlled so that it provides a satisfactory balance between erasing speed and retention property. When first insulating layer 212 is thinner, erasing of memory cell 200 is faster while the retention time of the memory state is shorter. On the other hand, when first insulating layer 212 is thicker, erasing becomes slower but the retention time becomes longer.

Also according with the present invention, a plurality of memory cells 200 may be arranged to form a memory array. In one aspect, the memory array is formed as a virtual ground array, wherein the bit lines are buried diffusion areas, and the word lines are gate contacts, such as polycrystalline silicon stripes. Memory cells in a column may share the same bit lines or buried diffusion areas, and memory cells in a row may share the same word line. Thus, the memory array is contact-less and does not require any field isolation. Therefore, the present invention may realize a very high density memory device.

Figure 5:
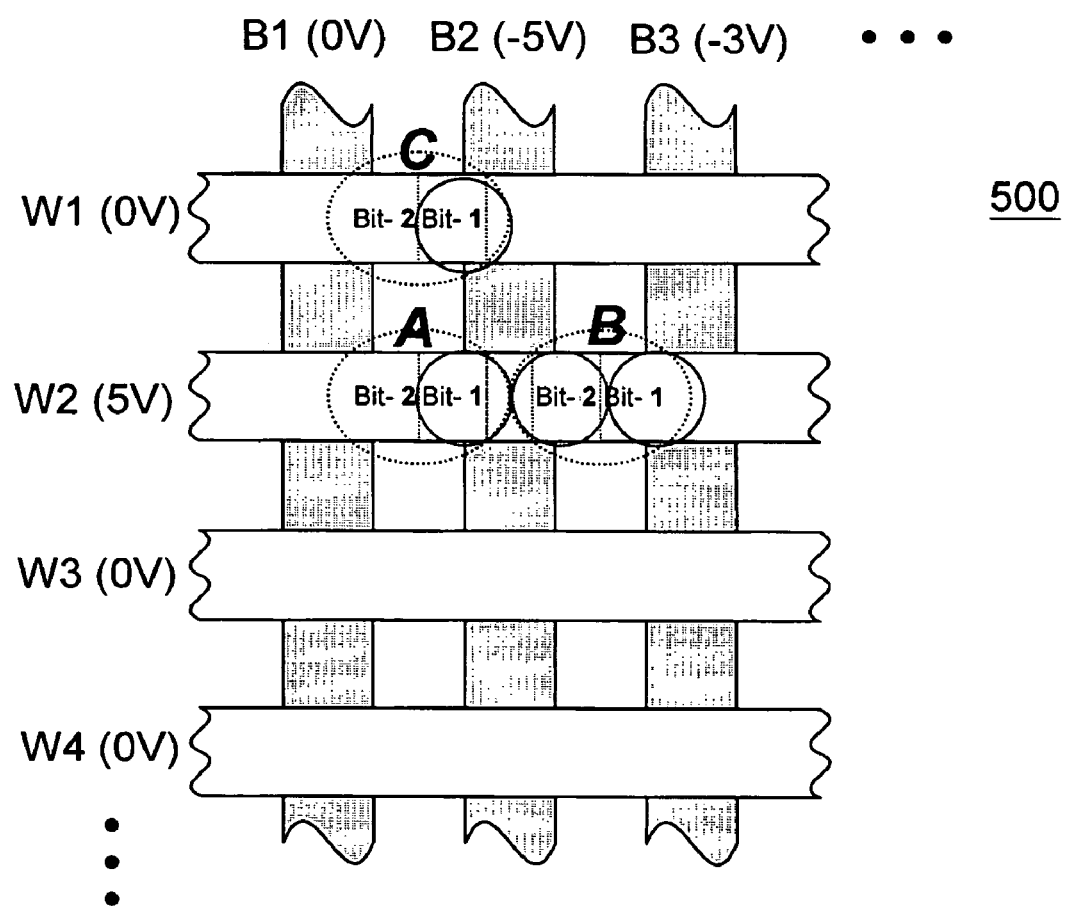
FIG. 5 shows a memory device consistent with a first embodiment of the present invention.

FIG. 5 shows a memory device 500 comprising a plurality of memory cells 200 arranged in a virtual ground array. Memory device 500 includes a plurality of word lines W1, W2, W3, W4, . . . , and a plurality of bit lines B1, B2, B3, . . . The intersections of word lines and bit lines define a plurality of memory cells, each of which having the same structure as memory cell 200. For example, memory cell A is defined by word line W2 and bit lines B1 and B2, wherein the gate of memory cell A corresponds to word line W2, the source of memory cell A corresponds to bit line B1, and the drain of memory cell A corresponds to bit line B2. Memory cell B is defined by word line W2 and bit lines B2 and B3. Memory cell C is defined by word line W1 and bit lines B1 and B2. Also shown in FIG. 5 is that each memory cell in memory device 500 may contain two bits of information, the corresponding storage sites of which are labeled as Bit-1 and Bit-2, respectively.

Using reading or programming schemes of the present invention, disturbance in memory device 500 may be reduced. For example, when programming Bit-1 of cell A, bit line B1 is grounded, bit line B2 is biased at −5V, word line W2 is biased at 5V, and the other word lines, W1, W3, W4, are grounded. Under such bias conditions, Bit-1 of cell A is being programmed, while Bit-1 of cell C is protected from disturbance because of the bias of 0V on the word line thereof. To protect Bit-2 of cell B from disturbance, bit line B3 is biased at −3V, whereby the electron injection in cell B is suppressed.

Figure 6:
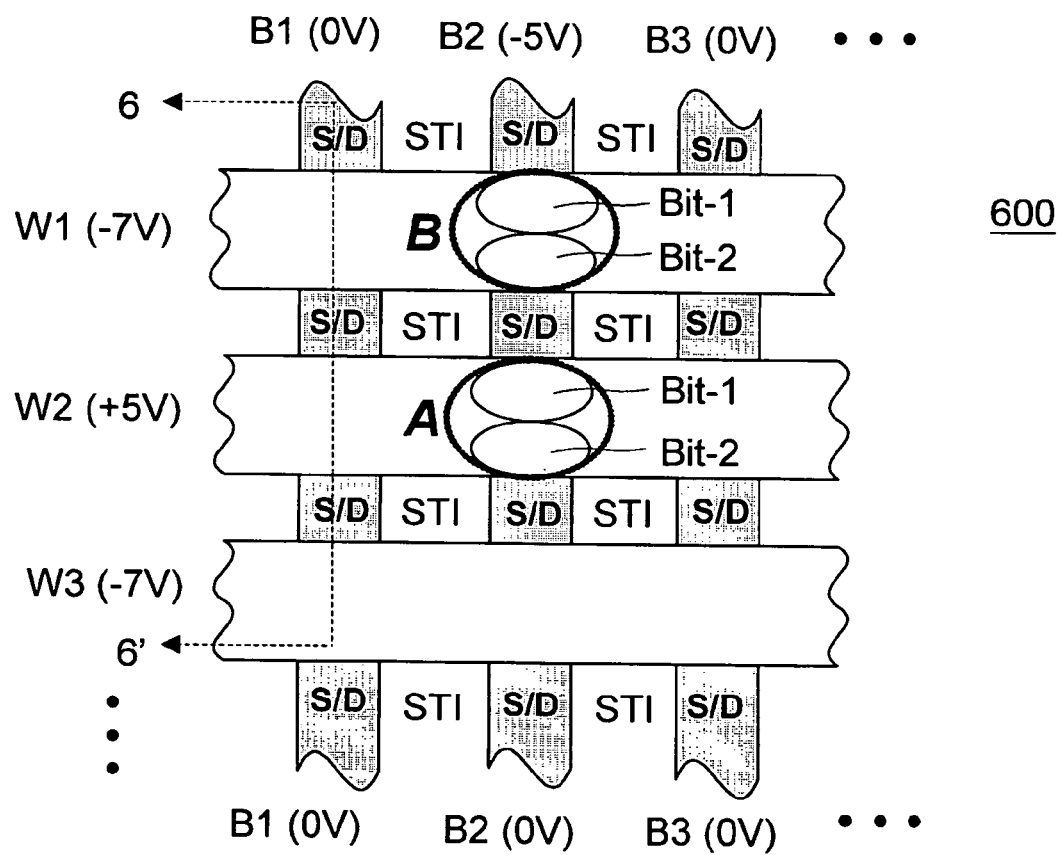
FIG. 6 shows a memory device consistent with a second embodiment of the present invention.
Figure 7:
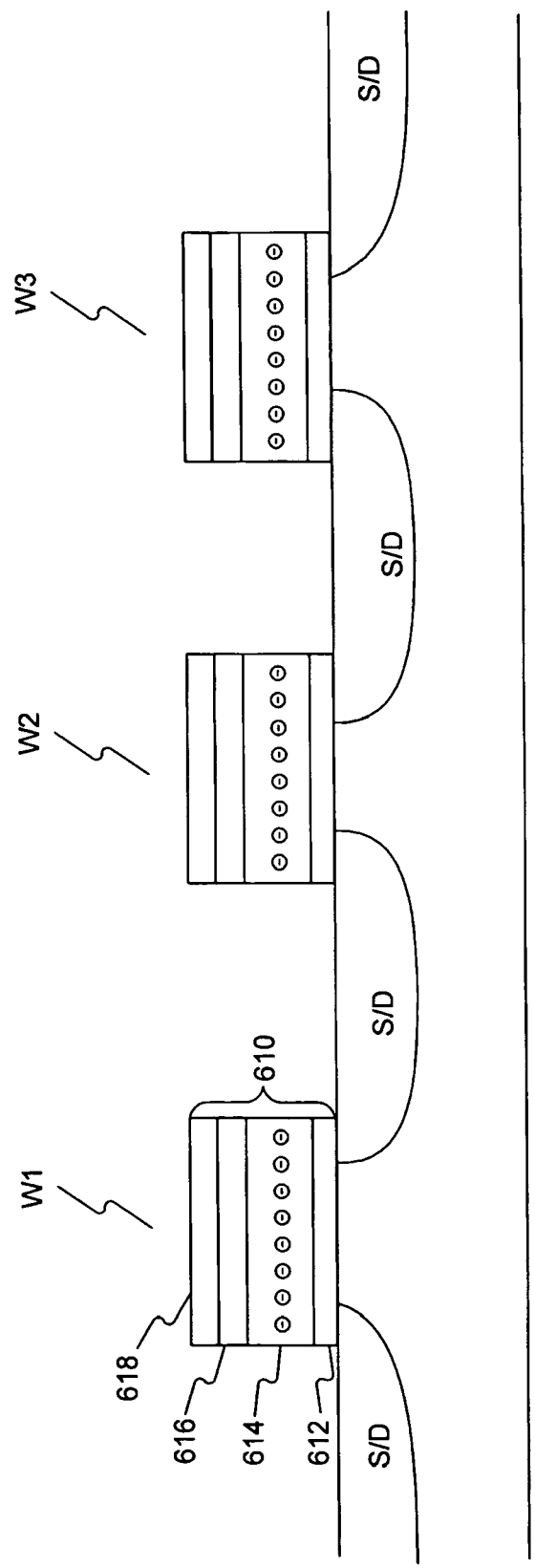
FIG. 7 shows a cross-sectional view of the memory device shown in FIG. 6 along line 6–6'.

FIG. 6 shows another memory device 600 according to the present invention and FIG. 7 shows a cross-sectional view of memory device 600 along line 6–6'. Memory device 600 includes a plurality of word lines W1, W2, W3, etc. Memory device 600 also includes a plurality of diffusion regions, labeled as "S/D" in FIGS. 6 and 7, which are spaced apart from one other. The diffusion regions "S/D" are arranged in a plurality of columns, each column forming a discontinuous bit line. More particularly, the substrate region directly beneath each word line and between adjacent S/D diffusion regions serve as a channel region between those diffusion regions. As shown in FIG. 6, memory device 600 includes a plurality of discontinuous bit lines B1, B2, B3, etc., and each of discontinuous bit lines B1, B2, B3, etc., includes a number of the spaced-apart diffusion regions "S/D". Therefore, each word line and two consecutive diffusion regions "S/D" of a discontinuous bit line form a transistor, or a memory cell of memory device 600, and consecutive transistors are connected in series. Each such transistor shares a diffusion region with another transistor along the same discontinuous bit line. For convenience of illustration, it is assumed that for each memory cell, as viewed in FIG. 6, the upper none of the two diffusion regions "S/D" thereof is the source, and lower one of the two diffusion regions "S/D" thereof is the drain. Persons of ordinary skill will now appreciate that "upper" and "lower" are only descriptive terms used relative to the orientation of the memory device as shown in FIG. 6. Each memory cell may store two bits of information, a first bit, Bit-1, that is adjacent to the source thereof, and a second bit, Bit-2, that is adjacent to the drain thereof. Also shown in FIG. 6 are cell A defined by word line W2 and discontinuous bit line B2 and cell B defined by word line W1 and discontinuous bit line B2. Each of the discontinuous bit lines in memory device 600 includes an upper end and a lower end and different biases may be applied to the upper end and lower end. In one aspect, each word line may have a gate structure 610 including a first insulating layer 612, a trapping layer 614, a second insulating layer 616, and a control gate 618, as shown in FIG. 7. First insulating layer 612 may comprise silicon dioxide, trapping layer 614 may comprise silicon nitride, second insulating layer 616 may comprise silicon dioxide, and control gate 618 may comprise polycrystalline silicon, a metal, metal silicide, or a combination thereof.

To select a memory cell of memory device 600, for example, cell A, all the word lines except W2 are biased at a turn-on voltage, and all the discontinuous bit lines except B2 are grounded at both the upper end and the lower end. In one aspect, the transistors of the memory cells are p-type MOS transistors, and the turn-on voltage is a negative voltage, for example, −7V. Thus, all the transistors along discontinuous bit line B2 except cell A are turned on.

Then, to program/erase/read cell A, respective sets of biases are applied on word line W2 and discontinuous bit line B2. For example, to program Bit-1 of cell A, word line W2 is biased at 5V, the upper end of discontinuous bit line B2 is biased at a negative voltage, e.g., −5V, and the lower end of discontinuous bit line B2 is grounded. Because all the other transistors along discontinuous bit line B2 are turned on, the source of cell A is biased at −5V and the drain of cell A is biased at 0V. Under such bias conditions, Bit-1 of cell A is programmed. Similarly, different sets of biases may be applied to word line W2 and respective ends of discontinuous bit line B2 to read or erase Bit-1 of cell A.

Compared to conventional memory device structures, wherein neighboring memory cells may share the same word line and one bit line, no memory cell in memory device 600 shares the same word line and at least one bit line with another memory cell. Therefore, disturbance to neighboring memory cells during reading/programming of a memory cell is greatly reduced.

A memory device comprising memory cells according to the present invention has several advantages over conventional memory devices. First, because electron injection efficiency is generally higher than hole injection, a memory device according to the present invention has a higher efficiency and, therefore, higher speed, than those memory devices that are programmed/erased by hole injection. Measured by the ratio of gate current to drain current, the electron injection efficiency may reach $10^{-2}$.

Second, because electron tunneling causes much less damage to the tunneling oxide than hole tunneling, a memory device according to the present invention provides better data retention properties.

Finally, because the memory device according to the present invention is reset or erased by reaching a balance between electron tunneling through the first and second insulating layers, the memory device is immune to plasma radiations that may generate carriers within the trapping layer.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operating a memory device, wherein the memory device includes an n-type substrate and a plurality of memory cells formed thereon, each memory cell including a control gate, a source region, a drain region, a channel region defined between the source and drain regions, a trapping layer provided above the channel region, a first insulating layer provided between the trapping layer and the channel region, and a second insulating layer provided between the trapping layer and the control gate, wherein the control gate corresponds to a word line, the source region corresponds to a first bit line, and the drain region corresponds to a second bit line, and wherein each memory cell includes a first bit portion and a second bit portion each for storing one bit of information, the method comprising:

resetting a selected memory cell, including
applying a first negative bias to the word line of the selected memory cell, and
applying a ground bias to both the first bit line and the second bit line; and
programming the first bit portion of the selected memory cell, including
applying a first positive bias to the word line of the selected memory cell,
applying a second negative bias to the first bit line of the selected memory cell, and
applying a ground bias to the second bit line of the selected memory cell.

2. The method of claim 1, further including providing the first bit portion of the memory cell as a part of the trapping layer adjacent to the corresponding first bit line, and providing a second bit portion as a part of the trapping layer adjacent to the corresponding second bit line.

3. The method of claim 1, further including resetting the selected memory cell by first and second electron tunneling processes, wherein in the first tunneling process, electrons tunnel from the control gate of the selected memory cell, through the first insulating layer of the selected memory cell, into the trapping layer of the selected memory cell, and in the second tunneling process, electrons tunnel out of the trapping layer of the selected memory cell, through the second insulating layer of the selected memory cell, into the channel region of the selected memory cell.

4. The method of claim 3, further including reaching a dynamic balance reached between the first and second electron tunneling processes when the selected memory cell is reset.

5. The method of claim 4, further comprising erasing the selected memory cell, including
applying a third negative bias to the word line of the selected memory cell, wherein the second negative bias has a predetermined high value, and
applying the ground bias to both the first bit line and the second bit line of the selected memory cell.

6. The method of claim 5, further including applying the third negative bias as approximately equal to the first negative bias.

7. The method of claim 6, further including reaching the dynamic balance between the first and second electron tunneling processes when the selected memory cell is erased.

8. The method of claim 1, wherein programming the first bit of the selected memory cell causes tunneling of electrons into a portion of the trapping layer adjacent the first bit line of the selected memory cell.

9. The method of claim 1, further comprising programming the second bit of the selected memory cell, including
applying a second positive bias to the word line of the selected memory cell,
applying a third negative bias to the second bit line of the selected memory cell, and
applying the ground bias to the first bit line of the selected memory cell.

10. The method of claim 1, further comprising reading the first bit portion of the selected memory cell, including
applying a second positive bias to the word line of the selected memory cell;
applying a ground bias to the first bit line of the selected memory cell; and
applying a third negative bias to the second bit line of the selected memory cell.

11. The method of claim 10, further including applying the second positive bias as smaller than a threshold voltage of the programmed first bit portion of the memory cell and greater than a threshold voltage of the selected memory before the first bit portion or the second bit portion thereof is programmed.

12. An operation method of a memory device, wherein the memory device includes a semiconductor substrate, a plurality of discontinuous bit lines formed in the substrate, each discontinuous bit line including a plurality of diffusion regions spaced apart from each other, and a plurality of word lines, each of which corresponds to a gate that comprises a material with a high work function and formed over the substrate, wherein the plurality of word lines and the plurality of discontinuous bit lines define a plurality of memory cells, each memory cell corresponding to one word line and two consecutive ones of the plurality of diffusion regions of a discontinuous bit line, and wherein each discontinuous bit line has a first end and a second end, the method comprising:

selecting a memory cell, including
applying a turn-on voltage to all of the plurality of word lines except the word line of the selected memory cell, and
applying a ground bias to both the first end and the second end of all of the plurality of discontinuous bit lines except the discontinuous bit line of the selected memory cell; and
operating the selected memory cell.

13. The method of claim 12, further including:
providing the semiconductor substrate with an n-type conductivity;
providing the plurality of diffusion regions with a p-type conductivity; and
applying the turn-on voltage as a negative voltage.

14. The method of claim 12, wherein operating the selected memory cell comprises resetting the selected memory cell, including
applying a first negative bias to the word line of the selected memory cell, and
applying the ground bias to both the first end and the second end of the discontinuous bit line of the selected memory cell.

15. The method of claim 14, further including providing the word line of each memory cell as a layer of control gate, and providing each memory cell as including an n-type substrate, a channel region defined between the corresponding two consecutive diffusion regions, a trapping layer provided above the channel region, a first insulating layer provided between the trapping layer and the channel region, and a second insulating layer provided between the trapping layer and the control gate.

16. The method of claim 15, further including resetting the selected memory cell by first and second electron tunneling processes, wherein in the first tunneling process, electrons tunnel from the control gate of the selected memory cell, through the first insulating layer of the selected memory cell, into the trapping layer of the selected memory cell, and in the second tunneling process, electrons tunnel out of the trapping layer of the selected memory cell, through the second insulating layer of the selected memory cell, into the channel region of the selected memory cell.

17. The method of claim 16, further including reaching a dynamic balance between the first and second electron tunneling processes when the selected memory cell is reset.

18. The method of claim 17, wherein operating the selected memory cell further comprises erasing the selected memory cell, including
applying a second negative bias to the word line of the selected memory cell, wherein the second negative bias has a high value, and
applying the ground bias to both the first bit line and the second bit line of the selected memory cell.

19. The method of claim 18, further including applying the second negative bias as approximately equal to the first negative bias.

20. The method of claim 19, further including reaching the dynamic balance between the first and second electron tunneling processes when the selected memory cell is erased.

21. The method of claim 12, wherein each memory cell includes a first bit portion and a second bit portion, and operating the selected memory cell comprises programming the first bit portion of the selected memory cell, including
applying a positive bias to the word line of the selected memory cell,
applying a negative bias to the first end of the discontinuous bit line of the selected memory cell, and
applying the ground bias to the second end of the discontinuous bit line of the selected memory cell.

22. The method of claim 12, wherein each memory cell includes a first bit portion and a second bit portion, and operating the selected memory cell comprises reading the first bit portion of the selected memory cell, including
applying a positive bias to the word line of the selected memory cell,
applying a ground bias to the first end of the discontinuous bit line of the selected memory cell, and
applying a negative bias to the second end of the discontinuous bit line of the selected memory cell.

23. The method of claim 22, further including applying the positive bias as smaller than a threshold voltage of the first bit portion of the memory cell when the first bit portion of the memory cell is programmed and greater than a threshold voltage of the selected memory before when the first bit portion or the second bit portion of the memory cell is not programmed.

* * * * *